(12) United States Patent
Van Rijs et al.

(10) Patent No.: US 6,437,420 B1
(45) Date of Patent: Aug. 20, 2002

(54) SEMICONDUCTOR ELEMENTS FOR SEMICONDUCTOR DEVICE

(75) Inventors: Freerk Van Rijs, Nijmegen; Ronald Dekker, Eindhoven, both of (NL)

(73) Assignee: Koninklijke Philips Electronics N. V., New York, NY (US)

( * ) Notice: Subject to any disclaimer, the term of this patent is extended or adjusted under 35 U.S.C. 154(b) by 0 days.

(21) Appl. No.: 09/613,227

(22) Filed: Jul. 10, 2000

(30) Foreign Application Priority Data

Jul. 10, 1999 (EP) .......................................... 99202274

(51) Int. Cl.[7] .......................................... H01L 27/082
(52) U.S. Cl. ...................... 257/584; 257/728; 257/778; 257/531
(58) Field of Search ................................ 257/584, 586, 257/565, 570–575, 724–728, 777, 778, 530–532, 678

(56) References Cited

U.S. PATENT DOCUMENTS

| 5,519,582 A | 5/1996 | Matsuzaki | 361/783 |
| 6,081,030 A | 6/2000 | Jaouen et al. | 257/728 |

FOREIGN PATENT DOCUMENTS

| EP | 0887861 A1 | 12/1998 |
| WO | 9603772 A2 | 2/1996 |
| WO | 9603772 | * 2/1996 | ......... H01L/21/768 |

* cited by examiner

*Primary Examiner*—Keith Christianson
*Assistant Examiner*—Yennhu B. Huynh
(74) *Attorney, Agent, or Firm*—Steven R. Biren

(57) ABSTRACT

The invention relates to a semiconductor device (100) with a semiconductor body (10) comprising at least one semiconductor element (H) with an active area (A) and a coil (20) coupled to said element (H). The coil (20) and a further coil (21) jointly form a transformer (F). The semiconductor body (10) is secured to a carrier plate (30) which comprises an electrically insulating material and is covered with a conductor track (21). According to the invention, the further coil (21) is positioned on the carrier plate (30) and is formed by the conductor track (21) and electrically separated from the coil (20). In this way, a-device (100) is obtained which is easier to manufacture than the known device. Moreover, the communication between the element (H) and the outside world does not involve an electrical coupling and hence, for example, bonding wires, are not necessary. The invention is particularly advantageous for a (discrete) bipolar transistor, which can suitably be used for surface mounting. The invention further comprises an easy method of manufacturing a device (100) according to the invention.

4 Claims, 1 Drawing Sheet

SEMICONDUCTOR ELEMENTS FOR SEMICONDUCTOR DEVICE

BACKGROUND OF THE INVENTION

The invention relates to a semiconductor device having a semiconductor body which comprises at least one semiconductor element with an active region and a coil, which coil is coupled to the semiconductor element and forms part of a transformer which includes a further coil, which semiconductor body is mounted onto a carrier plate which comprises an electrically insulating material and is provided with a conductor track.

Such a device, comprising, for example, a bipolar transistor as the semiconductor element, is used, inter alia, as an amplifier of electronic signals, in particular as a high-frequency power amplifier.

Such a device is disclosed in U.S. Pat. No. 5,519,582, published on May 21, 1996. In said patent specification (see FIG. 1), a description is given of a semiconductor device comprising a semiconductor body wherein an active semiconductor element is situated on the upper side, and the lower side of said semiconductor body is provided with a trench filled with a conductor, which trench forms a coil and is coupled to the semiconductor element. The semiconductor body is mounted on a carrier plate provided with a conductor track. Said carrier plate is, for example, a PCB (=Printed Circuit Board) or a ceramic substrate. The coil may form part of a transformer. An intended application of such a device is as a stable power supply.

A drawback of the known device resides in that the manufacture thereof is relatively complex because the semiconductor body must be subjected to many process steps on both sides. The integration of a transformer, and hence a further coil, in the semiconductor body renders the manufacture even more complicated and, in addition, a comparatively strong capacitive coupling between both coils occurs because the coils must be intertwined.

SUMMARY OF THE INVENTION

Therefore, it is an object of the invention to provide a device in which the above drawbacks are completely, or at least substantially, obviated, which device is easy to manufacture, and the transformer employed therein exhibits a small capacitive coupling between the coils.

To achieve this, a device of the type mentioned in the opening paragraph is characterized in accordance with the invention in that said further coil is situated on the carrier plate, forms part of the conductor track and is electrically separated from the coil. By positioning the further coil on the carrier plate, the manufacture of the device is simplified to a substantial degree because the semiconductor body has to be subjected to a larger number of process steps on one side only. In the formation of the further coil, a further simplification is obtained by using the conductor track which is situated on the carrier plate and which is necessary anyway. The invention is further based on the recognition that the two coils necessary for a transformer do not necessarily have to be either both integrated in the semiconductor body or both situated outside the semiconductor body. In fact, a device in accordance with the invention has an important additional advantage, partly as a result of the fact that both coils are electrically separated, the additional advantage being that the signal transfer from the external world to the semiconductor body now can take place in a contact-free manner, namely via the magnetic coupling of both coils instead of, for example, via electric connection wires.

In a preferred embodiment, the coil is situated on the same side of the semiconductor body as the active region of the semiconductor element. By virtue thereof, both the coil and the semiconductor element can be manufactured (for the most part) during the same process steps. For example, the conductor necessary to form the coil can also be used as the connection conductor for the semiconductor element.

Preferably, the active region of the semiconductor element and the coil are situated on one side of the semiconductor body which is secured with the other side to the carrier plate. In this modification, it is still possible to bring about a satisfactory magnetic coupling between the coil and the further coil. For this purpose, the diameter of the coils must be larger than the distance between the two coils. This distance is equal to the thickness of the semiconductor body and amounts to, for example, 500 μm in practice, while the diameter of the coil often amounts to, for example, 600 μm in practice.

In a favorable further modification, the semiconductor body is embodied so as to be thinner or interrupted at the location of the coil. This results in a particularly low parasitic capacitance and a good magnetic coupling because the magnetic lines extend through the semiconductor material, for example silicon.

A very attractive modification of a device in accordance with the invention, wherein the semiconductor element comprises a bipolar transistor having, a base, an emitter, and a collector, is characterized in that the semiconductor body is secured, on one side, to an insulating substrate by means of an adhesive layer, which semiconductor body comprises at least three mesa-shaped parts which include, respectively, the active region of the transistor and a collector-connection region, a base-connection region and an emitter-connection region, and by means of which mesa-shaped parts the semiconductor body is secured, on the other side, to a further conductor track on the carrier plate. In this modification, the thickness of the semiconductor body can be relatively small because the semiconductor body is secured to an insulating substrate. By virtue thereof, also the coil can have a relatively small diameter, without the magnetic coupling being adversely affected. In this case, the device is also very compact. In addition, the device can be readily manufactured by virtue of the SMD (=Surface Mounted Device) technique used to secure the semiconductor body on the carrier plate.

A method of manufacturing a semiconductor device comprising a semiconductor body wherein at least one semiconductor element with an active region is formed as well as a coil which is coupled to said semiconductor element, which coil forms part of a transformer which comprises a further coil, the semiconductor body being secured on a carrier plate which comprises an electrically insulating material and is provided with a conductor track, is characterized in accordance with the invention in that the further coil is provided on the carrier plate and formed in the conductor track and electrically separated from the coil. In this manner, a device in accordance with the invention is obtained in a simple manner.

In a favorable modification, the active region of the semiconductor element and the coil are formed on the same side of the semiconductor body. Preferably, the active region of the semiconductor element and the coil are formed on one side of the semiconductor body, and the semiconductor body is secured on the carrier plate on the other side. In a further favorable modification, the semiconductor body is embodied so as to be thinner or interrupted at the location of the coil.

In a preferred embodiment, wherein a bipolar transistor having an emitter, a base and a collector is formed as the semiconductor element, after the formation of the transistor and the coil on one side of the semiconductor body, said semiconductor body is glued onto an insulating substrate on this side, whereafter, on the other side of the semiconductor body, at least three mesa-shaped parts are formed from said semiconductor body by locally removing the semiconductor material of the semiconductor body, one of said mesa-shaped parts comprising the active region of the transistor and a collector-connection region, another mesa-shaped part comprising a base-connection region, and a further mesa-shaped part comprising an emitter-connection region, whereafter the semiconductor body is secured to a further conductor track on the carrier plate by means of said mesa-shaped parts.

These and other aspects of the invention will be apparent from and elucidated with reference to the embodiments described hereinafter.

DESCRIPTION OF THE PREFERRED EMBODIMENTS

Figure 1:
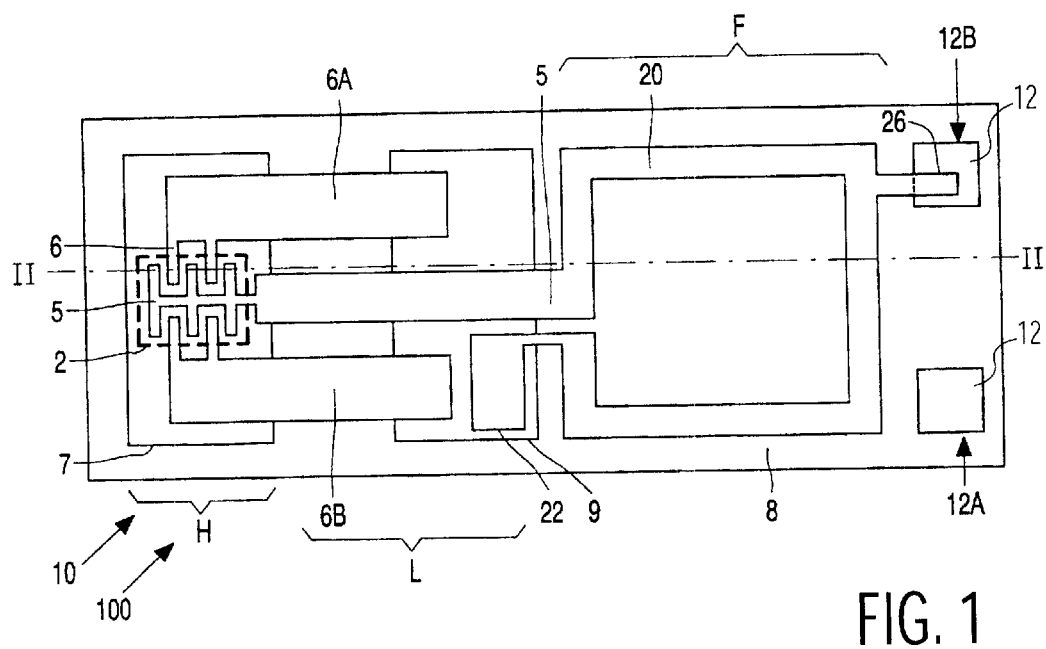
FIG. 1 diagrammatically shows a plan view of an embodiment of a semiconductor device in accordance with the invention.

The Figures are diagrammatic and not drawn to scale, and particularly the dimensions in the thickness direction are exaggerated for clarity. Semiconductor regions of the same conductivity type are generally hatched in the same direction. Like reference numerals refer to like parts whenever possible.

Figure 2:
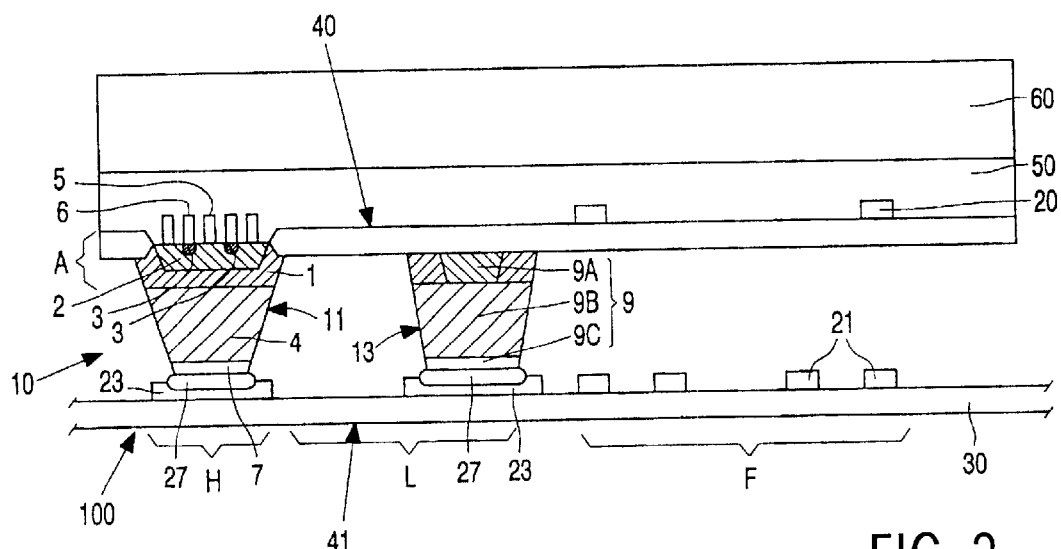
FIG. 2 is a diagrammatic, cross-sectional view, at right angles to the thickness direction and taken on the line II—II, of the device shown in FIG. 1, and FIG. 3 diagrammatically shows the electric circuit which corresponds to the device shown in FIG. 1.
Figure 3:
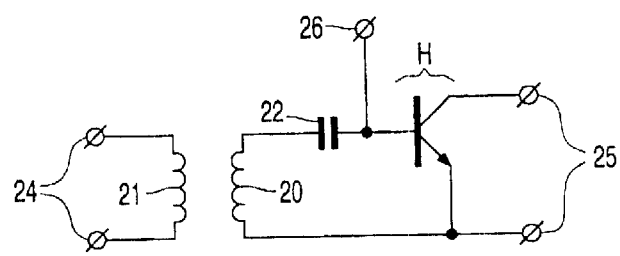

FIG. 1 is a diagrammatic, plan view of an embodiment of a semiconductor device 100 in accordance with the invention; FIG. 2 is a diagrammatic, cross-sectional view at right angles to the thickness direction, taken on the line II—II, of the device shown in FIG. 1, and FIG. 3 diagrammatically shows the electric circuit of the device shown in FIG. 1. The device 100 comprises, (see for example FIG. 2), a semiconductor body 10 having three mesa-shaped semiconductor parts 11, 12, 13 of silicon. The first mesa-shaped part 11 comprises the active region A of a bipolar transistor H, in this case an NPN transistor, including a collector region 1, a base region 2 and an emitter region 3. The first mesa-shaped part 11 also includes a collector-connection region 7 which is connected to the collector region 1 by means of a first connection conductor 4, which is made, in this case, of doped silicon. Above the mesa-shaped parts 11, 12, 13 there is an insulating layer 15 of silicon dioxide. Above said insulating layer there is a second and a third connection conductor 5, 6, respectively. The second connection conductor 5 is connected to a coil which, viewed in projection, is situated next to the mesa-shaped parts 11, 13, and which forms part of a transformer F which comprises a further coil 21. The single turn of the coil 20 opens into a capacitor 22 which, (also see FIG. 3), serves as a decoupling capacitance 22, which is integrated in the semiconductor body 10 in this case. The capacitor 22 is formed, in this case, by means of a LOCOS (=Local Oxidation of Silicon) oxide which is locally present on the mesa 13 and which has a capacitance of 2 fF/$\mu^2$, and the capacitor has a capacitance of 10 pF. This implies that the dimensions of the capacitor 22 are approximately 60×60 $\mu m^2$. The second connection conductor 5 is connected, via a further connection conductor 26, to a portion 12B of the second mesa-shaped part 12, which serves as the base-connection region 12B. Via the third connection conductor 6, the emitter region 3 is connected to an emitter-connection region 9 which is situated in the mesa-shaped part 13. In this case, the third connection conductor 6 comprises two portions 6A, 6B which are situated on either side of the second connection conductor 5 and form a transmission line L therewith. At the upper side 40, the semiconductor body 10 is connected, by means of an adhesive layer 50, to an insulating substrate 60, which is made of glass in this example. Both portions 12A, 12B of the second mesa-shaped part 12 stiffen the device 100 next to the coils 20, 21. At the lower side 41, the semiconductor body 10 is secured on a carrier plate 30, in this case a PCB carrier plate 30, which is provided with a conductor track 21.

In accordance with the invention, the further coil 21 is situated on the carrier plate 30, forms part of the conductor track 21 and is electrically separated from the coil 20. As the further coil 21 is situated on the carrier plate 30, the manufacture of the device in accordance with the invention is simplified. The semiconductor body 10 now only has to be subjected to a large number of process steps on one side 40 where the semiconductor element H is situated. In the formation of the further coil 21 use is made of a conductor track 21, which is already present on the carrier plate 30, resulting in a further simplification of the manufacturing process. By virtue of the fact that the coils 20, 21 are electrically separated, an additional and surprising advantage is obtained: the signal transfer from the device to the outside world, and conversely, can now take place in a contact-free manner, namely via magnetic coupling instead of electric connections, for example, in the form of bonding wires. The device in accordance with the invention can very suitably be used in (discrete) high-frequency power transistors H.

In this example, the semiconductor body 10 is also interrupted at the location of the coil 20. This implies a very low parasitic capacitance between the coils 20, 21 because, on the one hand, the dielectric constant of air is much smaller than that of silicon and, on the other hand, because air, unlike silicon, does not conduct electric current. A further advantage of the device of this example is that it is easy to manufacture because the semiconductor body 10 is mounted by means of the SMD technique. The thickness of the semiconductor body 10 can be relatively small, such as, in this case, 200 $\mu$m, which can be attributed to the fact that the semiconductor body 10 is secured to the insulating substrate 60. By virtue thereof, also the diameter of the coil may be relatively small, resulting in a very compact device in accordance with the invention.

Also at high frequencies, the device exhibits a high amplification of, for example, 20 dB, which can be attributed to the use of the transmission line T. Particularly at such a high amplification, the impedance difference of the device 100 with respect to, for example, 50Ω is relatively large, and a device in accordance with the invention then offers a very elegant adaptation of the impedance by virtue of the transformer F. In this example, the emitter region 3 and, at the location thereof, the third connection conductor 6 as well as the second connection conductor 5 have a comb structure. Both comb structures mesh together and extend perpendicularly to the longitudinal direction of the transmission line L.

If the primary winding 20 of the transformer F comprises only a single turn, the measures in accordance with the invention enable the entire semiconductor body 10 to be manufactured by means of a single metal layer process. In this example, the coil 21, which in this case is spiral-shaped, comprises two and a half turns. In this example, the carrier plate 30 is made by means of a multilayer metal process. One of the connections 24 of the coil 21 is situated in one of the (at least two) metal layers on the carrier plate 30, the other connection is situated in a further metal layer, not shown in FIG. 1 or 2, on the carrier plate 30. The discrete device 100 of this example can very suitably be used for a (discrete) RF (=Radio Frequency) power application. The coupling factor between the coils 20, 21 is 0.71 in this example. If the thickness of the semiconductor body 10 is further reduced, for example to 50 μm, then said value may even increase to 0.8. The impedance transformation then becomes 3.0. For a 0.5 W RF power transistor H (manufactured in a double poly process) the input impedance is approximately 1.5Ω, which is increased to approximately 4.5Ω by means of the transformer F. Such a "matching" by means of the transformer F implies that the matching circuit on the carrier plate 30 is simple. This has the additional advantage, with respect to an LC section, that the losses are lower at the same quality (Q-factor) of the coils 20, 21. This is very important if the transistor H is an output transistor.

The device in this example has the following dimensions: the mesa-shaped parts 11, 13 are 200 μm wide, 500 μm long and 200 μm high and the interspace between them is 250 μm. The dimensions of the mesa-shaped portions 12A, 12B are 100×100×200 μm$^3$. In this case, the width of the second connection conductor 5 is 75 μm, and said second connection conductor is situated at a distance of 50 μm from the adjacent sub-conductors 6A, 6B which, in this case, are twice as wide as the second connection conductor 5. The coils 20, 21 have an (internal) diameter of 500 μm, a width of 50 μm and a thickness of 1 μm. In this example, the mesa-shaped parts 11, 12, 13 are secured to a further conductor track 23 on the carrier plate 20 by means of solder balls 27. This conductor track comprises the connection points 24, 25, 26 of the coil 20 and the transistor H. As regards the other dimensions of the transistor, particularly the doping concentrations of the different semiconductor regions, reference is made to the international patent specification WO 96/03772, published on Feb. 8, 1996. Reference is made to the same patent specification for particularities regarding the manufacture of a device in accordance with the invention, which will be described hereinafter.

The device of this example is manufactured in the following manner, using a method in accordance with the invention. An n-type silicon substrate 4 is provided with an n-type epitaxial layer 1. The semiconductor body 10 thus formed is provided with a thermal oxide layer 15 wherein an opening is formed at the location of the mesa-shaped part 13 by means of photolithography and etching, through which opening the portion 9A of the emitter-connection region 8, 9 is formed by means of an n-type diffusion which reaches as far as the substrate 4. Subsequently, standard techniques which are known per se, such as oxidation, implantation and diffusion are used to form LOCOS (=Local Oxidation of Silicon) regions, the p-type base region 2 and, not shown in the drawing, the comb-shaped base contact region and the n-type emitter region 3. Next, a conducting layer 5, 6, such as a Ti/Pt/Au layer 5, 6 having a thickness of 1,1 μm is provided on the insulating layer 15 by means of, for example, sputtering. This layer 5, 6 is provided with the pattern shown in FIG. 1 by means of photolithography and etching, thereby providing the base region 2, or rather the above-mentioned base-contact region, with a connection conductor which is connected to the simultaneously formed coil 20. In addition, the emitter region 3 is connected to its connection regions 9 and the transmission line L is formed. Moreover, the patterned metal layer 5, 6 is provided with a scratch-resistant layer of silicon nitride, which is not shown in the drawing.

Subsequently, the conductor body 10 is provided with an UV-curable adhesive layer 30, which in this case comprises a hexanedioldiacrylate glue, and with an insulating substrate 40, which in this case is a 1 mm thick plate 40 of Pyrex glass through which the adhesive is cured by exposure to UV radiation. The substrate 4 is subsequently reduced in thickness, in this example, to 200 μm by means of, for example, a grinding process. Subsequently, the lower side of the semiconductor body 10 is covered with, for example, also a metal layer 7, 9C comprising, for example, Ti/Pt/Au on which, in this case, a PbSn/Cu/Au solder layer 27 is provided with a view to final assembly by means of soldering. This metal layer 7, 9C and the solder layer 27 are patterned by means of photolithography and etching, whereafter the semiconductor body 10 is locally removed by means of etching using a KOH-containing solution, in which process the mesa-shaped parts 11, 12, 13 are formed. In this process, also at the location of the coil 20, the silicon is entirely removed from the semiconductor body 10. By means of, for example, wire sawing, a semiconductor body 10 is eventually obtained which is ready for final assembly by means of SMD (akkoord?, delen Ned. Tekst weggevallen). The device 100 in accordance with the invention is finally obtained by securing the semiconductor body 10 on a PCB carrier plate 30 which is covered with the conductor tracks 21, 23. The conductor track 21 forms the secondary winding 21 of the transformer F and hence the connection between the base 2 of the transistor H and the outside world. The semiconductor body 10 is secured on the further conductor track 23 by means of soldering.

The invention is not limited to the examples given herein, and, within the scope of the invention, many modifications and variations are possible to a person skilled in the art. For example, different compositions and thicknesses can be used for the different (semiconductor) regions or layers. The invention is not limited to SMD or to discrete transistors. Application within CMOS or BICMOS technology is possible. The semiconductor body does not have to be locally interrupted (or thinned) nor does it have to be secured to an insulating substrate. The semiconductor body can also be used in a (purely) epitaxial transistor. Also in such a transistor, a part of the semiconductor body can be interrupted or thinned at the location of the coils by means of etching.

The metal layer used to form the transmission line and the coil may alternatively be provided on a thick synthetic resin layer. If the semiconductor body is manufactured by means of a multilayer metal process, a capacitor, if any, may be manufactured by means of a thicker dielectric between the metal layers instead of LOCOS oxide. This results, however, in a substantial increase in the dimensions of the capacitor.

What is claimed is:
1. A semiconductor device having a semiconductor body (10) which comprises at least one semiconductor element (H) with an active region (A) and a coil (20), which coil is coupled to the semiconductor element (H) and forms part of a transformer (F) which includes a further coil (21), which semiconductor body (10) is mounted onto a carrier plate (30)

which comprises an electrically insulating material and is provided with a conductor track (21), characterized in that said further coil (21) is situated on the carrier plate (30), forms part of the conductor track (21) and is electrically separated from the coil (20), and wherein the semiconductor body is thinner or interrupted at the location of the coil.

2. A semiconductor device as claimed in claim 1, characterized in that the coil (20) is situated on the same side (40) of the semiconductor body (10) as the active region (A) of the semiconductor element (H).

3. A semiconductor device as claimed in claim 1 characterized in that the active region (A) of the semiconductor element (H) and the coil (20) are situated on one side (40) of the semiconductor body (10) which is secured with the other side (41) to the carrier plate (30).

4. A semiconductor device as claimed in claim 1, wherein the semiconductor element (H) comprises a bipolar transistor having a collector (1), a base (2) and an emitter (3), characterized in that the semiconductor body (10) is secured, on one side (40), to an insulating substrate (60) by means of an adhesive layer (50), which. semiconductor body comprises at least three mesa-shaped parts (11, 12, 13) which include, respectively, the active region (A) of the connection region (9), and by means of which mesa-shaped parts the semiconductor body (10) is secured, on the other side (41), to a further conductor track (23) on the carrier plate (30).

* * * * *